(12) United States Patent
Choi et al.

(10) Patent No.: US 10,014,361 B2
(45) Date of Patent: Jul. 3, 2018

(54) ORGANIC LIGHT EMITTING DISPLAY DEVICE

(71) Applicant: LG Display Co., Ltd., Seoul (KR)

(72) Inventors: Jeong Hyeon Choi, Seoul (KR); Jae Hee Park, Gumi-si (KR); Joon Soo Han, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/139,124

(22) Filed: Apr. 26, 2016

(65) Prior Publication Data
US 2017/0194415 A1 Jul. 6, 2017

(30) Foreign Application Priority Data
Dec. 31, 2015 (KR) .......................... 10-2015-0191375

(51) Int. Cl.
*H01L 27/32* (2006.01)
*H01L 51/52* (2006.01)
(Continued)

(52) U.S. Cl.
CPC ........ *H01L 27/3279* (2013.01); *H01L 27/322* (2013.01); *H01L 27/3213* (2013.01);
(Continued)

(58) Field of Classification Search
CPC ............. H01L 27/3279; H01L 27/3213; H01L 27/322; H01L 27/3246; H01L 27/3258;
(Continued)

(56) References Cited

U.S. PATENT DOCUMENTS

2003/0203643 A1* 10/2003 Hasei .................. B41J 2/14233
438/758
2005/0179374 A1 8/2005 Kwak
(Continued)

FOREIGN PATENT DOCUMENTS

EP 2031658 3/2009
EP 2061083 5/2009
(Continued)

OTHER PUBLICATIONS

Extended European Search Report for European Patent Application EP 16204821.9, dated Jun. 8, 2017, 8 Pages.
(Continued)

*Primary Examiner* — Christine Enad
(74) *Attorney, Agent, or Firm* — Fenwick & West LLP

(57) ABSTRACT

Disclosed is an organic light emitting display device which includes an auxiliary line connected to a first power line and an auxiliary electrode connected to a second power line, thereby lowering a line resistance of each of the first and second power lines. The organic light emitting display device includes a substrate, a thin film transistor (TFT) disposed on the substrate, a first power line disposed in a first layer including the source electrode and the drain electrode of the TFT, a second power line disposed over the first layer, an auxiliary line disposed in a second layer including the second power line, an anode electrode disposed on the second power line and the auxiliary line and electrically connected to the drain electrode, an organic layer disposed on the anode electrode, and a cathode electrode covering the organic layer and electrically connected to the second power line.

17 Claims, 4 Drawing Sheets

(51) Int. Cl.
*H01L 51/50* (2006.01)
*H01L 51/00* (2006.01)

(52) U.S. Cl.
CPC ...... *H01L 27/3246* (2013.01); *H01L 27/3258* (2013.01); *H01L 51/0096* (2013.01); *H01L 51/5056* (2013.01); *H01L 51/5072* (2013.01); *H01L 51/5218* (2013.01); *H01L 51/5228* (2013.01); *H01L 51/5234* (2013.01); *H01L 51/5253* (2013.01); *H01L 51/5284* (2013.01); *H01L 27/3276* (2013.01); *H01L 2251/308* (2013.01)

(58) Field of Classification Search
CPC ............ H01L 51/5056; H01L 51/5072; H01L 51/5218; H01L 51/5228; H01L 51/5234; H01L 51/5253; H01L 51/5284
See application file for complete search history.

(56) References Cited

U.S. PATENT DOCUMENTS

| | | |
|---|---|---|
| 2006/0082284 A1 | 4/2006 | Shibusawa |
| 2008/0197778 A1 | 8/2008 | Kubota |
| 2011/0175097 A1 | 7/2011 | Song et al. |
| 2012/0205678 A1 | 8/2012 | Ikeda et al. |
| 2013/0187131 A1 | 7/2013 | Chung et al. |
| 2015/0372072 A1 | 12/2015 | Xiong et al. |
| 2017/0076667 A1* | 3/2017 | Numata ............... G09G 3/3233 |

FOREIGN PATENT DOCUMENTS

| | | |
|---|---|---|
| JP | 2005227788 A | 8/2005 |
| JP | 2006113376 A | 4/2006 |
| JP | 2011150992 A | 8/2011 |
| JP | 2012182120 A | 9/2012 |
| JP | 2013149971 A | 8/2013 |

OTHER PUBLICATIONS

Notice of Reason for Refusal for Japanese Patent Application No. JP 2016-233737, dated Oct. 24, 2017, 6 Pages, (With English Translation).

* cited by examiner

ORGANIC LIGHT EMITTING DISPLAY DEVICE

CROSS-REFERENCE TO RELATED APPLICATIONS

This application claims the benefit of the Korean Patent Application No. 10-2015-0191375 filed on Dec. 31, 2015, which is hereby incorporated by reference as if fully set forth herein.

BACKGROUND

Field of the Disclosure

The present disclosure relates to an organic light emitting display device, and more particularly, to an organic light emitting display device for decreasing a line resistance.

Discussion of the Related Art

Instead of using a mouse or a keyboard as an input device, a flat panel display (FPD) device includes a touch screen that enables a user to directly input information with a finger or a pen. Since users can easily manipulate the touch screen, the use of touch screens is increasing.

FPD devices have good characteristics such as thinness, lightness, and low power consumption. Examples of the FPD devices include liquid crystal display (LCD) devices, plasma display panels (PDPs), and organic light-emitting display devices. Recently, electrophoretic display (EPD) devices are being widely used as one type of the FPD device.

Among flat panel display devices, LCD devices and an organic light emitting display devices including thin film transistors (TFTs) have good resolution, color display, and image quality, and thus are used as display devices for notebook computers, tablet computers, or desktop computers.

In particular, organic light emitting display devices are self-emitting devices, and have low power consumption, a fast response time, high emission efficiency, high luminance, and a wide viewing angle. Therefore, the organic light emitting display devices are attracting much attention as next-generation FPD devices.

A related art organic light emitting display device includes a first substrate, a thin film transistor (TFT), an organic light emitting diode (OLED), a first power line, and a second power line. The first substrate includes a plurality of gate lines and a plurality of data lines which intersect each other to define a plurality of pixel areas, and the TFT is provided in each of the plurality of pixel areas. The OLED includes an anode electrode, an organic layer, and a cathode electrode. The anode electrode is electrically connected to the TFT, and the organic layer is provided on the anode electrode. The cathode electrode is provided all over the first substrate.

The first power line is provided in the same layer as that of each of a source electrode and a drain electrode of the TFT and applies first power EVDD, supplied from an external power supply, to each pixel.

The second power line is connected to the cathode electrode to apply second power EVSS to the cathode electrode. In the related art organic light emitting display device, when line resistances of the first and second power lines are too high, it is difficult to normally drive the organic light emitting display device due to voltage drop (proportional to current and resistance).

SUMMARY

Accordingly, the disclosed subject matter includes an organic light emitting display device that substantially obviates one or more problems due to limitations and disadvantages of the related art.

According to one aspect, an organic light emitting display device includes an auxiliary line connected to a first power line and an auxiliary electrode connected to a second power line, thereby lowering a line resistance of each of the first and second power lines.

Additional advantages and features will be set forth in part in the description which follows and in part will become apparent to those having ordinary skill in the art upon examination of the following or may be learned from practice of the disclosed subject matter. The objectives and other advantages may be realized and attained by the structure particularly pointed out in the written description and claims hereof as well as the appended drawings.

To achieve these and other advantages, as embodied and broadly described herein, an organic light emitting display device includes a substrate, a thin film transistor (TFT) disposed in a first layer, a first power line disposed in the first layer and electrically connected to the source electrode and supplying a first voltage, a second power line disposed in a second layer over the TFT and supplying a second voltage lower than the first voltage, an auxiliary line disposed in the second layer with the second power line, an anode electrode disposed over the second power line and the auxiliary line and electrically connected to the drain electrode, an organic layer disposed on the anode electrode, and a cathode electrode covering the organic layer and electrically connected to the second power line.

According to another aspect, the organic light emitting display device includes a substrate, a plurality of data lines disposed on the substrate along a first direction, a first power line disposed along the first direction in a first layer on the substrate in an emissive area, the first power line supplying a first voltage, a second power line disposed in the emissive area and in a second layer disposed over the first layer, the second power line supplying a second voltage lower than the first voltage, an auxiliary line disposed on the first power line in the second layer with the second power line, the auxiliary line electrically connected to the first power line, a pixel disposed on the substrate in the emissive area, and a transmissive area of the substrate disposed adjacent to the pixel. The pixel includes a plurality of subpixels arranged within the pixel along the first direction, and the pixel includes a thin film transistor (TFT) disposed in the emissive area, the TFT including a source electrode and a drain electrode disposed in the first layer, the source electrode electrically connected to the first power line, the TFT disposed under the second power line, an anode electrode disposed in the emissive area and over the second layer, the anode electrode electrically connected to the drain electrode of the TFT, an organic layer disposed on the anode electrode in the emissive area, and a cathode electrode covering the organic layer, the cathode electrode electrically connected to the second power line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosed subject matter and are incorporated in and constitute a part of this application, illustrate embodiments of the disclosed subject matter and together with the description serve to explain the principles of the disclosed subject matter. In the drawings.

DETAILED DESCRIPTION

Figure 1:
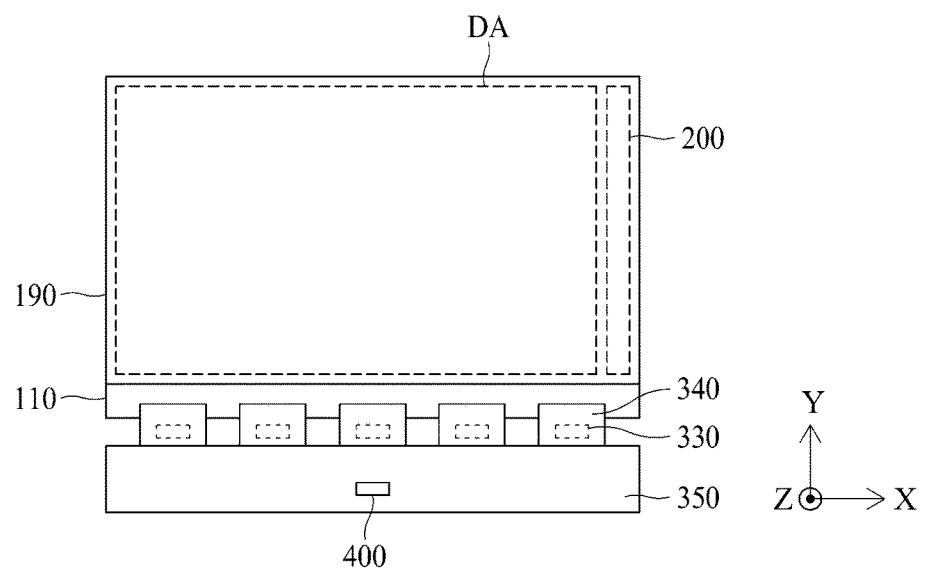
FIG. 1 is an diagram illustrating an organic light emitting display device according to an embodiment.

Reference will now be made in detail to the embodiments, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a," "an," and "the" are intended to include the plural forms as well, unless the context clearly indicates otherwise. The terms "first," "second," and so forth are for differentiating one element from the other element, and these elements should not be limited by these terms. It will be further understood that the terms "comprises," "comprising," "has," "having," "includes," and/or "including," when used herein, specify the presence of stated features, integers, steps, operations, elements, and/or components, but do not preclude the presence or addition of one or more other features, integers, steps, operations, elements, components, and/or groups thereof. The terms "at least one" and "one or more" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, embodiments of an organic light emitting display device will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the disclosed subject matter, such detailed description will be omitted.

Figure 2:
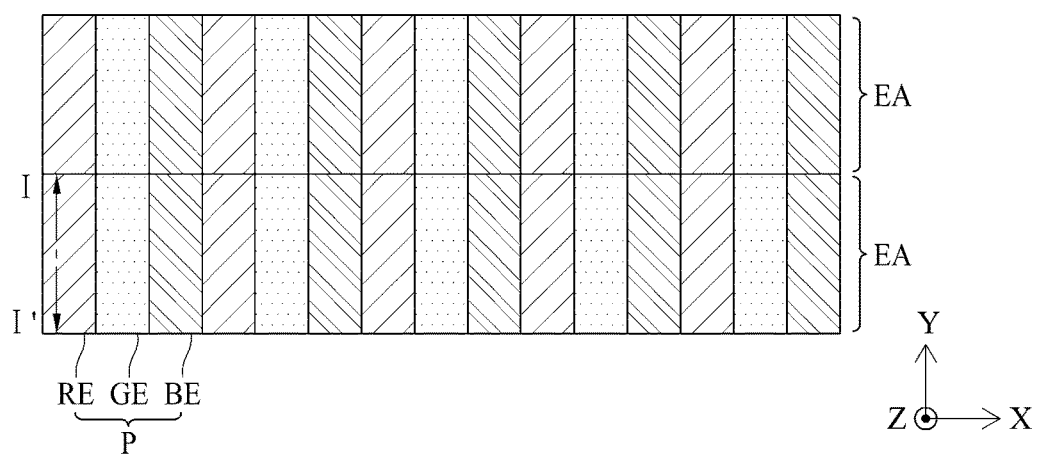
FIG. 2 is a plan view illustrating some of a plurality of pixels arranged in a display area according to an embodiment.
Figure 3:
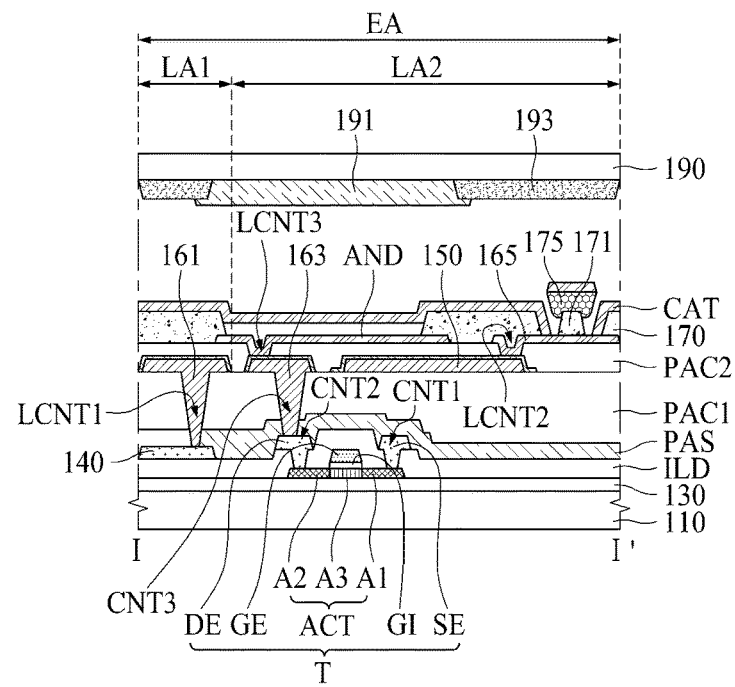
FIG. 3 is a cross-sectional view illustrating a cross-sectional surface of one side of an organic light emitting display device according to an embodiment.
Figure 4:
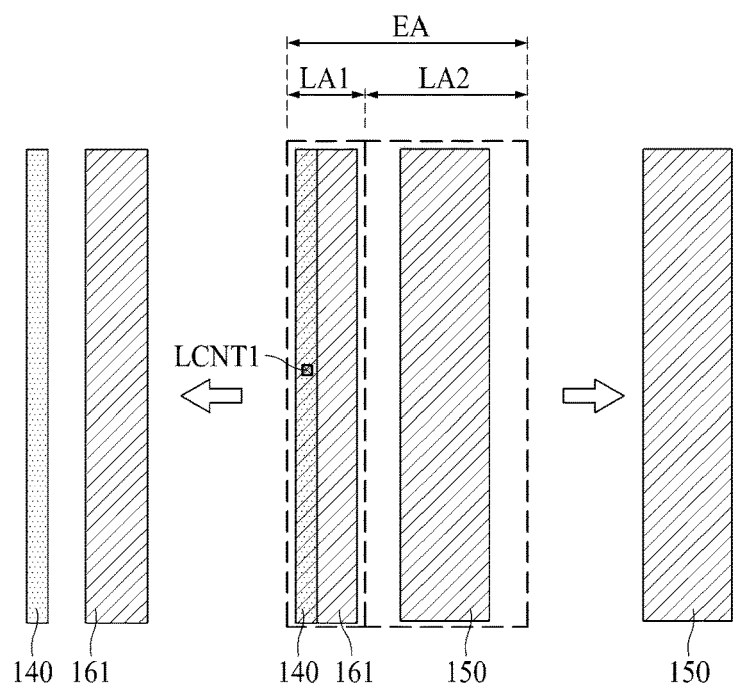
FIG. 4 is a plan view illustrating only a first power line, an auxiliary line, and a second power line of FIG. 3.

FIG. 1 is an diagram illustrating an organic light emitting display device according to an embodiment. FIG. 2 is a plan view illustrating some of a plurality of pixels arranged in a display area according to an embodiment. FIG. 3 is a cross-sectional view illustrating a cross-sectional surface of one side of an organic light emitting display device according to an embodiment. FIG. 4 is a plan view illustrating only a first power line, an auxiliary line, and a second power line of FIG. 3.

Hereinafter, an organic light emitting display device according to an embodiment will be described with reference to FIGS. 1 to 4. In FIGS. 1 to 4, the X axis indicates a direction parallel to a gate line, the Y axis indicates a direction parallel to a data line, and the Z axis indicates a height direction of the organic light emitting display device.

Referring to FIGS. 1 to 4, the organic light emitting display device according to an embodiment may include an organic light emitting display panel 100, a gate driver 200, a source drive integrated circuit (IC) 330, a flexible film 340, a circuit board 350, and a timing controller 400.

The organic light emitting display panel 100 may include a first substrate 110 and a second substrate 190, which face each other. The second substrate 190 may include one or more color filters. The first substrate 110 may be formed greater in size than the second substrate 190, and for this reason, a portion of the first substrate 110 may be exposed without being covered by the second substrate 190.

A plurality of gate lines and a plurality of data lines may be formed in a display area DA of the organic light emitting display panel 100, and a plurality of emission parts may be respectively disposed in intersection areas of the gate lines and the data lines. The emission parts disposed in the display area DA may display an image.

The display area DA may include an emission area EA. The emission area EA may include a plurality of pixels P. In FIG. 2, each of the pixels P is illustrated as including a red emission part RE, a green emission part GE, and a blue emission part BE, but is not limited thereto. For example, each of the pixels P may further include a white emission part in addition to the red emission part RE, the green emission part GE, and the blue emission part BE. Alternatively, each of the pixels P may include two or more of the red emission part RE, the green emission part GE, the blue emission part BE, a yellow emission part, a magenta emission part, a cyan emission part.

The red emission part RE may correspond to an area which emits red light, the green emission part GE may correspond to an area which emits green light, and the blue emission part BE may correspond to an area which emits blue light. The red emission part RE, the green emission part GE, and the blue emission part BE disposed in the emission part EA may each emit certain light. As illustrated in FIG. 3, a TFT T and an OLED may be included in each of red emission part RE, the green emission part GE, and the blue emission part BE. The data lines overlap with the emission area EA.

In detail, the organic light emitting display panel 100 may include the first substrate 110, a buffer layer 130, the thin film transistor T, a first power line 140, a passivation layer PAS, a first planarization layer PAC1, a second power line 150, an auxiliary line 161, a connection line 163, a second planarization layer PAC2, the OLED, an auxiliary electrode 165, a bank 170, and the second substrate 190.

The first substrate 110 may be a transparent glass substrate or a plastic film. For example, the first substrate 110 may be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, or the like, but is not limited thereto.

The buffer layer 130 may be provided on the first substrate 110. The buffer layer 130 prevents water from penetrating into the organic light emitting display panel 100 from the first substrate 110 vulnerable to penetration of water. Also, the buffer layer 130 prevents impurities such as metal ions and/or the like from being diffused to penetrate into an active layer ACT of the TFT T from the first substrate 110. For example, the buffer layer 130 may be formed of silicon dioxide ($SiO_2$), silicon nitride (SiNx), silicon oxynitride (SiON), or a multilayer thereof, but is not limited thereto.

The TFT T may be provided on the buffer layer 130. The TFT T may include the active layer ACT, a gate insulator GI, a gate electrode GE, an interlayer dielectric ILD, a source electrode SE, and a drain electrode DE.

The active layer ACT may be provided on the buffer layer 130. The active layer ACT may overlap the gate electrode GE. The active layer ACT may include one end area A1, which is disposed to contact the source electrode SE, the other end area A2, which is disposed to contact the drain electrode DE, and a center area A3, which is disposed between the one end area A1 and the other end area A2. The center area A3 may include an un-doped semiconductor material, and the one end area A1 and the other end area A2 may include a doped semiconductor material.

The gate insulator GI may be provided on the active layer ACT. The gate insulator GI may insulate the active layer ACT from the gate electrode GE. The gate insulator GI may cover the active layer ACT. For example, the gate insulator GI may be formed of silicon dioxide ($SiO_2$), silicon nitride (SiNx), silicon oxynitride (SiON), or a multilayer thereof, but is not limited thereto.

The gate electrode GE may be provided on the gate insulator GI. The gate electrode GE may overlap with the center area A3 of the active layer ACT (when viewed from above or below), and the gate insulator GI is between the gate electrode GE and the active layer ACT. For example, the gate electrode GE may be formed of one of molybdenum (Mo), aluminum (Al), chromium (Cr), gold (Au), titanium (Ti), nickel (Ni), neodymium (Nd), and copper (Cu) or a single layer or a multilayer including an alloy thereof, but is not limited thereto.

The interlayer dielectric ILD may be provided on the gate electrode GE. The interlayer dielectric ILD may insulate the gate electrode GE from the source electrode SE and the drain electrode DE. For example, the interlayer dielectric ILD may be formed of silicon dioxide ($SiO_2$), silicon nitride (SiNx), silicon oxynitride (SiON), or a multilayer thereof, but is not limited thereto.

The source electrode SE and the drain electrode DE may be disposed on the interlayer dielectric ILD to be spaced apart from each other. The gate insulator GI and the interlayer dielectric ILD may include a first contact hole CNT1, which exposes a portion of the one end area A1 of the active layer ACT, and a second contact hole CNT2 which exposes a portion of the other end area A2 of the active layer ACT. The source electrode SE may be connected to the one end area A1 of the active layer ACT through the first contact hole CNT1, and the drain electrode DE may be connected to the other end area A2 of the active layer ACT through the second contact hole CNT2. For example, the source electrode SE and the drain electrode DE may each be formed of one of molybdenum (Mo), aluminum (Al), chromium (Cr), gold (Au), titanium (Ti), nickel (Ni), neodymium (Nd), and copper (Cu) or a single layer or a multilayer including an alloy thereof, but is not limited thereto.

A configuration of the TFT T is not limited thereto, and may be variously modified into a known configuration easily realized by those skilled in the art.

The first power line 140 may be provided on the interlayer dielectric ILD. The first power line 140 may apply a first source voltage, supplied from the external power supply, to each pixel P. The first power line 140 may be disposed on the same layer as that of each of the source electrode SE and the drain electrode DE. The first power line 140 may be electrically connected to the source electrode SE of the TFT. The first power line 140 may not overlap the source electrode SE and the drain electrode DE. That is, the first power line 140 may be spaced apart from the source electrode SE and the drain electrode DE. The first power line 140 may be electrically connected to the auxiliary line 161 to be described below. The first power line 140 may be disposed in the emissive area EA along a direction parallel to the data lines.

The first power line 140 may be provided through the same process as that of each of the source electrode SE and the drain electrode DE at the same time. The first power line 140 may be formed of the same material as that of each of the source electrode SE and the drain electrode DE. For example, the first power line 140 may be formed of one of molybdenum (Mo), aluminum (Al), chromium (Cr), gold (Au), titanium (Ti), nickel (Ni), neodymium (Nd), and copper (Cu) or a single layer or a multilayer including an alloy thereof, but is not limited thereto.

The passivation layer PAS may be provided on the TFT T and the first power line 140. The passivation layer PAS protects the TFT T and the first power line 140. For example, the passivation layer PAS may be formed of silicon dioxide ($SiO_2$), silicon nitride (SiNx), silicon oxynitride (SiON), or a multilayer thereof, but is not limited thereto.

The first planarization layer PAC1 may be provided on the passivation layer PAS. The first planarization layer PAC1 may planarize a top of the first substrate 110 on which the TFT T and the first power line 140 are provided. For example, the first planarization layer PAC1 may be formed of acryl resin, epoxy resin, phenolic resin, polyamides resin, polyimides resin, and/or the like, but is not limited thereto.

The passivation layer PAS and the first planarization layer PAC1 may include a third contact hole CNT3 which exposes the drain electrode DE. The drain electrode DE may be electrically connected to the connection line 163 through the third contact hole CNT3.

The second power line 150 may be provided on the TFT T, with the first planarization layer PAC1 provided between the second power line 150 and the TFT T. A second source voltage EVSS which is lower than the first source voltage may be supplied to the second power line 150. The second power line 150 may be electrically connected to the auxiliary electrode 165 and a cathode electrode CAT, and the second source voltage EVSS may be supplied to the cathode electrode CAT through the second power line 150. As illustrated in FIG. 4, the second power line 150, the auxiliary line 161, and the connection line 163 may be disposed on the first planarization layer PAC1, and thus may be formed to have a sufficiently wide area. Therefore, an area (or width) of the second power line 150 provided in a second line area LA2 disposed on the first planarization layer PAC1 and an area (or width) of the auxiliary line 161 provided in a first line area LA1 disposed on the first planarization layer PAC1 may each be greater than an area (or width) of the first power line 140. Width may be measured in a direction parallel to the first substrate 110 and perpendicular to a direction of the data lines. The second power line 150 may be disposed in the emissive area EA along a direction parallel to the data lines.

Since the second source voltage is applied through the second power line 150, the second power line 150 may have an increased area that decreases resistance of the second power line 150 in order to reduce voltage drops along the length of the second power line 150. In other words, the increased area of the second power line 150 improves stability of the second source voltage and improves independence of the second source voltage from resistance of the second power line 150. Since the auxiliary line 161 is connected to the first power line 140, the first power line 140 and the auxiliary line 161 together have an increased area that decreases resistance in order to reduce voltage drops along the length of the first power line 140 and auxiliary line 161. In other words, the increased area of the first power line 140 and the auxiliary line 161 improves stability of the first source voltage and improves independence of the first source voltage from resistance of the first power line 140. An area (or width) of the second power line 150 may be greater than that of the auxiliary line 161. Width may be measured in a direction parallel to the first substrate 110 and perpendicular to a direction of the data lines. For example, the second power line 150 may be formed of one of molybdenum (Mo), aluminum (Al), chromium (Cr), gold (Au), titanium (Ti), nickel (Ni), neodymium (Nd), and copper (Cu) or a single layer or a multilayer including an alloy thereof, but is not limited thereto.

The auxiliary line 161 may be provided in the same layer as that of the second power line 150. The auxiliary line 161 and the second power line 150 may be disposed to be spaced apart from each other. The auxiliary line 161 may be provided on the first power line 140. The first planarization layer PAC1 and the passivation layer PAS for insulating the auxiliary line 161 from the first power line 140 may be disposed between the auxiliary line 161 and the first power line 140. In this case, the passivation layer PAS and the first planarization layer PAC1 may include a first line contact hole LCNT1 which passes through the passivation layer PAS and the first planarization layer PAC1 and exposes the first power line 140. The first power line 140 may be electrically connected to the auxiliary line 161 through the first line contact hole LCNT1. The auxiliary line 161 may be provided through the same process as that of the second power line 150 at the same time and may be formed of the same material as that of the second power line 150. The auxiliary line 161 may be disposed in the emissive area EA along a direction parallel to the data lines.

The connection line 163 may be disposed on the first planarization layer PAC1. The connection line 163 may connect the drain electrode DE to an anode electrode AND. The connection line 163 may be provided in the same layer as that of each of the auxiliary line 161 and the second power line 150. The connection line 163 may be disposed between the auxiliary line 161 and the second power line 150. The connection line 163 may be disposed to be spaced apart from the auxiliary line 161 and the second power line 150. The connection line 163 may be provided through the same process as that of the second power line 150 at the same time and may be formed of the same material as that of the second power line 150.

In addition, a clad which covers the second power line 150, the auxiliary line 161, and the connection line 163 may be provided on the second power line 150, the auxiliary line 161, and the connection line 163. The clad prevents the second power line 150, the auxiliary line 161, and the connection line 163 from being oxidized. For example, the second planarization layer PAC2 may be provided on the second power line 150, the auxiliary line 161, and the connection line 163, and a process of forming the second planarization layer PAC2 may include a thermal treatment process of curing the second planarization layer PAC2. In this case, the second power line 150, the auxiliary line 161, and the connection line 163, which are provided under the second planarization layer PAC2, may be oxidized by the thermal treatment process. However, in an embodiment, the clad may cover the second power line 150, the auxiliary line 161, and the connection line 163, thereby preventing the second power line 150, the auxiliary line 161, and the connection line 163 from being oxidized. For example, the clad may include indium tin oxide (ITO) or indium zinc oxide (IZO).

The second planarization layer PAC2 may be provided to cover the second power line 150, the auxiliary line 161, and the connection line 163. A second line contact hole LCNT2 which passes through the second planarization layer PAC2 and exposes a portion of the second power line 150 may be provided in the second planarization layer PAC2. Also, a third line contact hole LCNT3 which passes through the second planarization layer PAC2 and exposes a portion of the connection line 163 may be provided in the second planarization layer PAC2. For example, the second planarization layer PAC2 may be formed of acryl resin, epoxy resin, phenolic resin, polyamides resin, polyimides resin, and/or the like, but is not limited thereto. The second planarization layer PAC 2 insulates the auxiliary line 161, the second power line 150, and the connection line 163 from each other.

The OLED may be connected to the TFT T. The OLED may be provided on the TFT T. The OLED may include the anode electrode AND, an organic layer EL, and the cathode electrode CAT.

The anode electrode AND may be disposed on the second power line 150, the auxiliary line 161, and the connection line 163. The anode electrode AND may be electrically connected to the connection line 163 which is connected to the drain electrode DE of the TFT T through the third line contact hole LCNT3 included in the second planarization layer PAC2. The anode electrode AND may include a transparent conductive material (for example, ITO, IZO, or the like) having a work function value that is relatively large. Also, the anode electrode AND may be formed of two or more layers including a metal material (e.g., Al, Ag, APC (Ag;Pb;Cu), or the like) that has good reflection efficiency.

The auxiliary electrode 165 may be provided in the same layer as that of the anode electrode AND. The auxiliary electrode 165 may be disposed to be spaced apart from the anode electrode AND. The auxiliary electrode 165 may be electrically connected to the second power line 150 which is exposed through the second line contact hole LCNT2. The auxiliary electrode 165 may be electrically connected to the cathode electrode CAT, for lowering a resistance of the cathode electrode CAT. The second power line 150 may be electrically connected to the cathode electrode CAT by the auxiliary electrode 165. The auxiliary electrode 165 may be formed through the same process as that of the anode electrode AND at the same time and may be formed of the same material as that of the anode electrode AND.

The bank 170 may be provided between adjacent anode electrodes AND. The bank 170 may electrically insulate the adjacent anode electrodes AND. The bank 170 may cover one side of the anode electrode AND. For example, the bank 170 may be formed of an organic material (e.g., an organic layer such as polyimides resin, acryl resin, benzocyclobutene (BCB), or the like) including a black pigment such as carbon black or the like, but is not limited thereto.

The organic layer EL may be provided on the anode electrode AND. The organic layer EL may include a hole transporting layer, an organic light emitting layer, and an electron transporting layer. Furthermore, the organic layer EL may further include one or more function layers for enhancing the emission efficiency and/or lifetime of the organic light emitting layer.

The cathode electrode CAT may be provided on the organic layer EL and the bank 170. When a voltage is applied to the cathode electrode CAT and the anode electrode AND, a hole and an electron may move to the organic layer EL through the hole transporting layer and the electron transporting layer and may be combined with each other to emit light. The cathode electrode CAT may use a metal material which has a very thin thickness and a low work function. For example, the cathode electrode CAT may use a metal material such as Ag, Ti, Al, Mo, or an alloy of Ag and Mg. Also, the above-described metal materials may be formed to a thickness of several hundreds angstrom (A) and may be used as the cathode electrode CAT. In this case, the cathode electrode CAT may be formed of a semi-transmissive layer and may be used as a substantially transparent cathode.

When the cathode electrode CAT is used as a transparent cathode, the cathode electrode CAT may be thinned in thickness, and for this reason, a resistance may relatively increase. The cathode electrode CAT may be connected to the auxiliary electrode 165, for lowering a resistance of the cathode electrode CAT. However, since the auxiliary electrode 165 is disposed in the same layer as that of the anode electrode AND, there is a limitation in a space where the auxiliary electrode 165 is to be provided. As an area of the auxiliary electrode 165 contacting the cathode electrode CAT becomes wider, a resistance of the cathode electrode CAT is further reduced. However, since the auxiliary electrode 165 is disposed in only an area where the anode electrode AND is not provided, there is a limitation in increasing a size of the auxiliary electrode 165, and for this reason, there is a limitation in lowering a resistance of the cathode electrode CAT. In order to overcome such limitations, the second power line 150 connected to the auxiliary electrode 165 may be provided under the auxiliary electrode 165. Since the cathode electrode CAT is connected to the auxiliary electrode 165 and the second power line 150, a resistance of the cathode electrode CAT is further reduced than a case where the cathode electrode CAT is connected to the auxiliary electrode 165 but not the second power line 150.

In addition, a partition wall 175 and a partition wall supporting part 171 may be provided on the auxiliary electrode 165. The partition wall 175 may have a reverse taper structure where a width of a lower surface of the partition wall 175 (on the wall supporting part 171) is narrower than that of an upper surface of the partition wall 175 (opposite the wall supporting part 171). The reverse taper structure may be a structure where both side surfaces symmetric about a center line are inclined, and a width of a lower surface is narrower than that of an upper surface. In this case, the cathode electrode CAT may not be disposed in a partial area of a top of the auxiliary electrode 165 adjacent to the partition wall 175. Although only one pixel is illustrated in the drawing, a plurality of the cathode electrodes CAT which are respectively formed in pixels adjacent to the bank 170 may be separated from each other by the partition wall 175. Therefore, the same voltage may be applied to the cathode electrodes CAT which are respectively formed in the pixels, and thus, the luminance uniformity of the organic light emitting display device is enhanced.

The second substrate 190 may be disposed to face the first substrate 110. The second substrate 190 may be provided on the TFT T and the OLED. The second substrate 190 may be a color filter substrate that includes a color filter 191 and a black matrix 193. A red pattern, a green pattern, a blue pattern, any other color pattern, or a combination thereof may be provided in the color filter 191. The color filter 191 may be used to realize a color in the organic light emitting display panel 100. The black matrix 193 may be disposed between the red pattern, green pattern, and blue pattern of the color filters 191 and may distinguish or block red light, green light, blue light, and light of any other color. Since the black matrix 193 is provided, a contrast of the organic light emitting display panel 100 is enhanced, and a leakage current of the TFT T is reduced.

The gate driver 200 may sequentially supply gate signals to the gate lines according to a gate control signal input from the timing controller 400. In FIG. 1, the gate driver 200 is illustrated as being provided outside one side of the display area DA of the organic light emitting display panel 100 in a gate driver in panel (GIP) type, but is not limited thereto. That is, the gate driver 200 may be provided outside each of both sides of the display area DA of the organic light emitting display panel 100 in the GIP type. Alternatively, the gate driver 200 may be manufactured as a driving chip, mounted on a flexible film, and attached to the organic light emitting display panel 100 in a tape automated bonding (TAB) type.

The source drive IC 330 may receive digital video data and a source control signal from the timing controller 400. The source drive IC 330 may convert the digital video data into analog data voltages according to the source control signal and may respectively supply the analog data voltages to the data lines. When the source drive IC 330 is manufactured as a driving chip, the source drive IC 330 may be mounted on the flexible film 340 in a chip on film (COF) type or a chip on plastic (COP) type.

Since a size of the first substrate 110 is greater than that of the second substrate 190, a portion of the first substrate 110 may be exposed without being covered by the second substrate 190. A plurality of pads such as a data pad or the like may be provided in the portion of the first substrate 110 which is exposed without being covered by the second substrate 190.

A plurality of lines connecting the pads to the source drive IC 330 and a plurality of lines connecting the pads to lines of the circuit board 350 may be provided in the flexible film 340. The flexible film 340 may be attached to the pads by using an anisotropic conductive film (ACF), and thus, the pads may be connected to the lines of the flexible film 340.

The circuit board 350 may be attached to a plurality of the flexible films 340. A plurality of circuits which are respectively implemented as a plurality of driving chips may be mounted on the circuit board 350. For example, the timing controller 400 may be mounted on the circuit board 350. The circuit board 350 may be a printed circuit board (PCB) or a flexible printed circuit board (FPCB).

The timing controller 400 may receive digital video data and a timing signal from an external system board. The timing controller 400 may generate the gate control signal for controlling an operation timing of the gate driver 200 and a source control signal for controlling a plurality of the source drive ICs 330, based on the timing signal. The timing controller 400 may supply the gate control signal to the gate driver 200 and may supply the source control signal to the source drive ICs 330.

In the above-described organic light emitting display device according to an embodiment, since the first power line 140 is electrically connected to the auxiliary line 161, a resistance of the first power line 140 is reduced without any increase in area of the first power line 140. Also, in an embodiment, an area of the first power line 140 is reduced in proportion to an increase in area of the auxiliary line 161, and thus, a design area of the TFT is widened. Accordingly, a process defect which occurs in a process of manufacturing a TFT is reduced.

Figure 5:
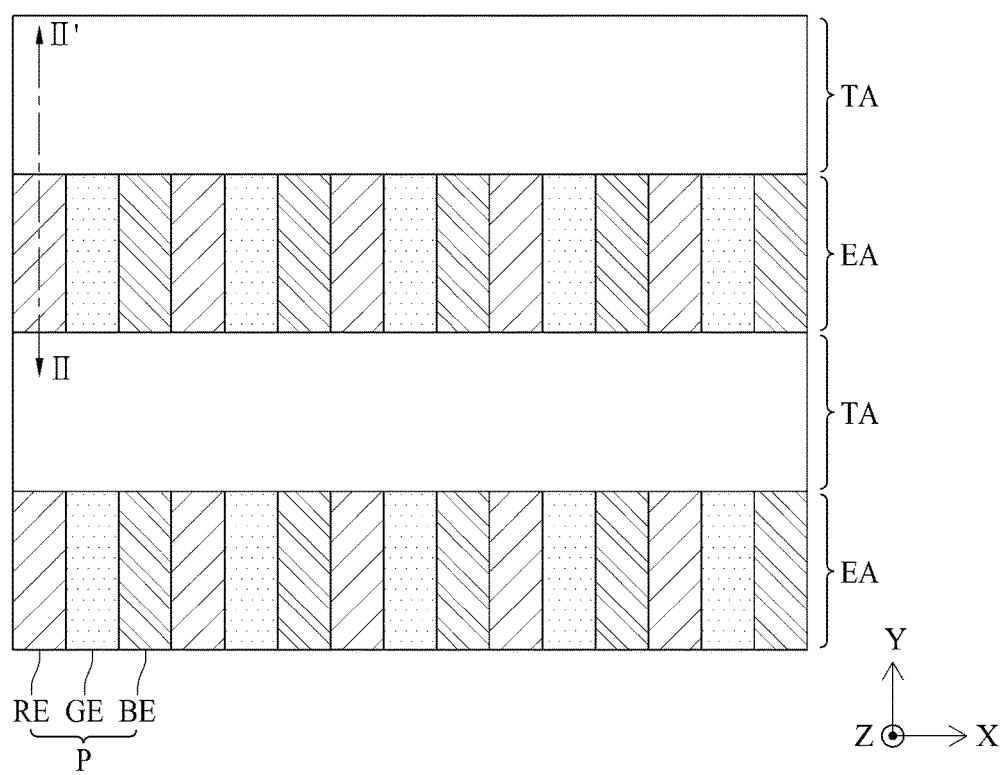
FIG. 5 is a plan view illustrating some of a plurality of pixels arranged in a display area according to another embodiment.
Figure 6:
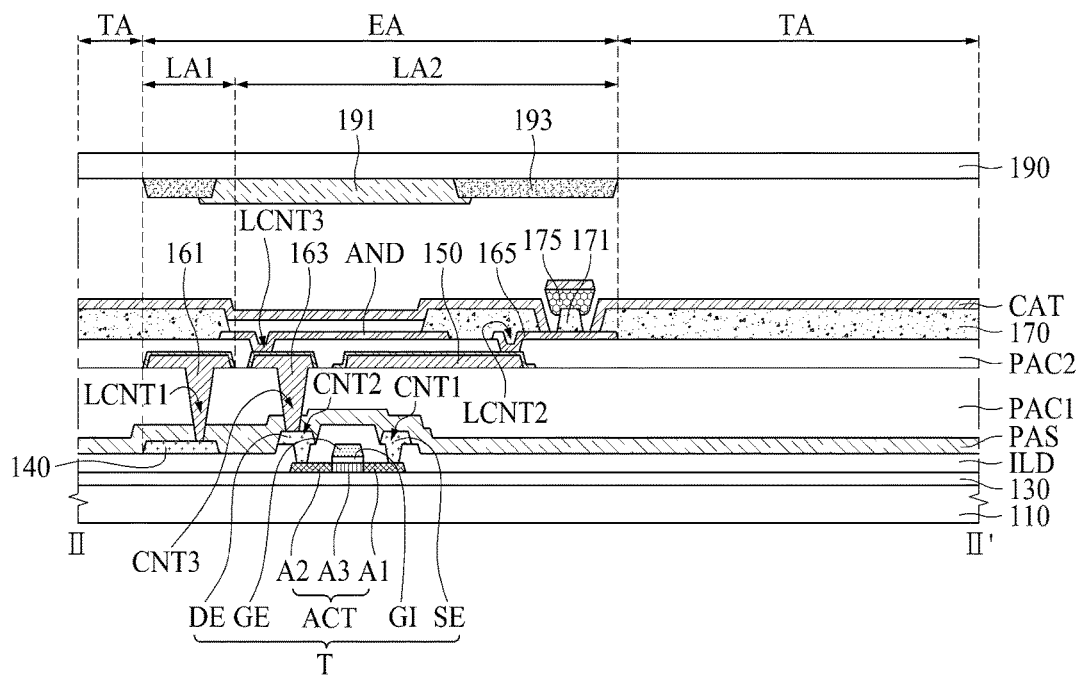
FIG. 6 is a cross-sectional view illustrating a cross-sectional surface of one side of an organic light emitting display device according to another embodiment.
Figure 7:
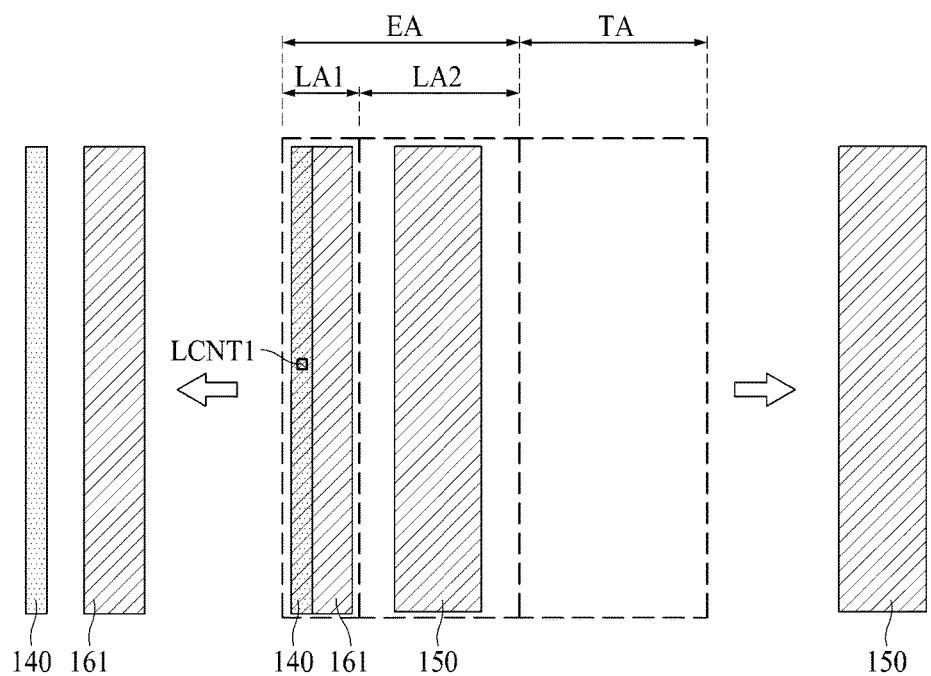
FIG. 7 is a plan view illustrating only a first power line, an auxiliary line, and a second power line of FIG. 6.

FIG. 5 is a plan view illustrating some of a plurality of pixels arranged in a display area according to another embodiment. FIG. 6 is a cross-sectional view illustrating a cross-sectional surface of one side of an organic light emitting display device according to another embodiment. FIG. 7 is a plan view illustrating only a first power line, an auxiliary line, and a second power line of FIG. 6. In this case, an organic light emitting display device according to an embodiment may be used as a transparent display device. As elsewhere in description, like reference numerals refer to like elements having similar material and structure in order to omit repetitive description of similar elements.

Referring to FIGS. 5 to 7, a display area DA of the organic light emitting display device according to another embodiment may include a plurality of transmissive areas TA coplanar with a plurality of emission areas EA. A transmissive areas TA is disposed adjacent to one or more corresponding emission areas EA. Due to the transmissive areas TA, a user may look at an object or a background located behind a rear surface of an organic light emitting display panel 100 from the front of the organic light emitting display panel 100. Due to the emission areas EA, the organic light emitting display panel 100 may display an image. In FIG. 5, it is illustrated that the transmissive areas TA and the emission areas EA are long formed in a lengthwise direction (an X-axis direction) of a gate line, but the present embodiment is not limited thereto. That is, the transmissive areas TA and the emission areas EA may be long formed in a lengthwise direction (a Y-axis direction) of a data line.

The transmissive areas TA may be areas that transmit incident light as-is. The emission areas EA may be areas emitting light. The emission areas EA may include a plurality of pixels P. Each of the pixels P, as illustrated in FIG. 5, may include a red emission part RE, a green emission part GE, and a blue emission part BE, but a pixel P may include fewer or additional emission parts. As illustrated in FIG. 6, each of the red emission part RE, the green emission part GE, and the blue emission part BE may include a TFT T, a first power line 140, a second power line 150, an auxiliary line 161, and an OLED.

The first power line 140 may be disposed on the same layer as that of each of a source electrode SE and a drain electrode DE of the TFT T. The second power line 150 may be disposed in a second line area LA2 and may be electrically connected to the auxiliary electrode 165 and a cathode electrode CAT. The auxiliary line 161 may be disposed in a first line area LA1 and may be provided in the same layer as that of the second power line 150. The auxiliary line 161 may be provided on the first power line 140 and may be electrically connected to the first power line 140 and a first line contact hole LCNT1.

The organic light emitting display device according to the embodiment illustrated in FIGS. 5-7 provides the same effects and advantages as the organic light emitting display device according to the embodiment illustrated in FIGS. 2-4. Furthermore, in the organic light emitting display device according to the embodiment illustrated in FIGS. 5-7, an area of the first power line is reduced in proportion to an increase in area of the auxiliary line, and thus, when the organic light emitting display device is used as a transparent display device, an aperture ratio of each of the transmissive areas TA is enhanced. This occurs at least in part because the first power line 140, the second power line 150, and the auxiliary line 161 do not cross the transmissive area TA.

As described above, according to the embodiments, the first power line and the auxiliary line which are provided on different layers may be electrically connected to each other, and thus, a resistance of the first power line is reduced without any increase in area of the first power line.

Moreover, according to the embodiments, an area of the first power line is reduced in proportion to an increase in area of the auxiliary line, and thus, a design area of the TFT is widened. According to the embodiments, a process defect which occurs in a process of manufacturing a TFT is reduced.

Moreover, according to the embodiments, an area of the first power line is reduced, and thus, when the organic light emitting display device is used as a transparent display device, an aperture ratio of each of the transmissive areas is enhanced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light emitting display device comprising:
   a substrate;
   a thin film transistor (TFT) disposed on the substrate, the TFT including a source electrode and a drain electrode disposed in a first layer;
   a first power line disposed in the first layer and electrically connected to the source electrode, the first power line supplying a first voltage;
   a second power line disposed in a second layer disposed over the TFT, the second power line supplying a second voltage;
   an auxiliary line disposed in the second layer with the second power line, the auxiliary line electrically connected to the first power line;
   an anode electrode disposed over the second power line and the auxiliary line and electrically connected to the drain electrode;
   an organic layer disposed on the anode electrode;
   a cathode electrode covering the organic layer and electrically connected to the second power line; and
   a connection line provided between the auxiliary line and the second power line, the connection line electrically connecting the drain electrode to the anode electrode.

2. The organic light emitting display device of claim 1, further comprising:
   a first planarization layer disposed between the first power line and the auxiliary line, wherein the auxiliary line is electrically connected to the first power line through a first contact hole exposing the first power line.

3. The organic light emitting display device of claim 1, further comprising:
an auxiliary electrode provided in a third layer comprising the anode electrode, the auxiliary electrode electrically connecting the second power line to the cathode electrode.

4. The organic light emitting display device of claim 3, further comprising:
a second planarization layer disposed between the second power line and the auxiliary electrode,
wherein the auxiliary electrode is electrically connected to the second power line through a second contact hole exposing the second power line.

5. The organic light emitting display device of claim 3, wherein the auxiliary electrode and the anode electrode comprise a same material.

6. The organic light emitting display device of claim 1, wherein the second power line is spaced apart from the auxiliary line.

7. The organic light emitting display device of claim 1, wherein a width of the second power line is greater than a width of the auxiliary line and a width of the first power line.

8. The organic light emitting display device of claim 1, wherein a width of the auxiliary line is greater than a width of the first power line.

9. The organic light emitting display device of claim 1, wherein the connection line, the auxiliary line, and the second power line comprise a same material.

10. The organic light emitting display device of claim 1, wherein the TFT, the first power line, the second power line, the auxiliary line, the anode electrode and the organic layer are disposed in an emission area disposed adjacent to a transmissive area.

11. An organic light emitting display device comprising:
a substrate;
a plurality of data lines disposed on the substrate along a first direction;
a first power line disposed along the first direction in a first layer on the substrate in an emissive area, the first power line supplying a first voltage;
a second power line disposed in the emissive area and in a second layer disposed over the first layer, the second power line supplying a second voltage;
an auxiliary line disposed on the first power line in the second layer with the second power line, the auxiliary line electrically connected to the first power line;
a pixel disposed on the substrate in the emissive area, the pixel comprising a plurality of subpixels arranged within the pixel along the first direction, the pixel including:
a thin film transistor (TFT) disposed in the emissive area, the TFT including a source electrode and a drain electrode disposed in the first layer, the source electrode electrically connected to the first power line;
an anode electrode disposed in the emissive area and over the second layer, the anode electrode electrically connected to the drain electrode of the TFT;
an organic layer disposed on the anode electrode in the emissive area; and
a cathode electrode covering the organic layer, the cathode electrode electrically connected to the second power line;
a transmissive area of the substrate disposed adjacent to the pixel; and
a connection line provided between the auxiliary line and the second power line, the connection line electrically connecting the drain electrode to the anode electrode.

12. The organic light emitting display device of claim 11, further comprising an auxiliary electrode disposed in a third layer comprising the anode electrode, the auxiliary electrode electrically connecting the second power line to the cathode electrode.

13. The organic light emitting display device of claim 12, wherein the auxiliary electrode and the anode electrode comprise a same material.

14. The organic light emitting display device of claim 12, further comprising:
a wall supporting part disposed on the auxiliary electrode; and
a partition wall disposed on the wall supporting part, the partition wall separating the cathode electrode from an adjacent cathode electrode disposed in the transmissive area.

15. The organic light emitting display device of claim 11, wherein the second power line is spaced apart from the auxiliary line.

16. The organic light emitting display device of claim 11, wherein the connection line, the auxiliary line, and the second power line comprise a same material.

17. The organic light emitting display device of claim 11, wherein the first power line, the second power line, and the auxiliary line are disposed parallel to each other in the emissive area.

* * * * *